United States Patent
Schuett et al.

(10) Patent No.: US 10,937,714 B2
(45) Date of Patent: Mar. 2, 2021

(54) ELECTRICAL DEVICE HAVING A COVERING MATERIAL

(71) Applicant: Robert Bosch GmbH, Stuttgart (DE)

(72) Inventors: Klaus-Volker Schuett, Wernau (DE); Andreas Harzer, Schwieberdingen (DE); Georg Hejtmann, Mundelsheim (DE); Ulrike Taeffner, Stuttgart (DE); Lars Epple, Gerlingen (DE); Petra Stedile, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 17 days.

(21) Appl. No.: 15/775,338

(22) PCT Filed: Nov. 17, 2016

(86) PCT No.: PCT/EP2016/077919
§ 371 (c)(1),
(2) Date: May 10, 2018

(87) PCT Pub. No.: WO2017/089207
PCT Pub. Date: Jun. 1, 2017

(65) Prior Publication Data
US 2018/0374775 A1 Dec. 27, 2018

(30) Foreign Application Priority Data
Nov. 26, 2015 (DE) ..................... 10 2015 223 443.6

(51) Int. Cl.
*H01L 23/373* (2006.01)
*H01L 23/36* (2006.01)
*H01L 23/29* (2006.01)

(52) U.S. Cl.
CPC ........ *H01L 23/3733* (2013.01); *H01L 23/291* (2013.01); *H01L 23/295* (2013.01); *H01L 23/36* (2013.01)

(58) Field of Classification Search
None
See application file for complete search history.

(56) References Cited

U.S. PATENT DOCUMENTS

| 6,221,509 B1 | 4/2001 | Hirano et al. |
| 2003/0194544 A1 | 10/2003 | Tobita et al. |

(Continued)

FOREIGN PATENT DOCUMENTS

| DE | 10 2013 112 267 A1 | 5/2015 |
| JP | 61-51859 A | 3/1986 |

(Continued)

OTHER PUBLICATIONS

International Search Report corresponding to PCT Application No. PCT/EP2016/077919, dated Feb. 3, 2017 German and English language document) (7 pages).

(Continued)

*Primary Examiner* — Alexander G Ghyka
(74) *Attorney, Agent, or Firm* — Maginot, Moore & Beck LLP

(57) ABSTRACT

An electrical device includes an electrical component that is at least partially covered by a covering material that includes a cement material. The covering material also includes particles having a first material and fibers having a second material. The first material and the second material each possess a higher coefficient of thermal conductivity than the cement of the cement material.

14 Claims, 2 Drawing Sheets

(56) References Cited

U.S. PATENT DOCUMENTS

| | | | |
|---|---|---|---|
| 2006/0135705 A1* | 6/2006 | Vallance | C08F 283/08 525/391 |
| 2007/0054105 A1* | 3/2007 | Hsiao | H01L 23/3733 428/292.1 |
| 2008/0121845 A1* | 5/2008 | Mills | C08G 65/18 252/500 |
| 2008/0299300 A1 | 12/2008 | Wilcoxon et al. | |
| 2009/0232991 A1 | 9/2009 | Wang et al. | |
| 2010/0044881 A1 | 2/2010 | Fujimoto | |
| 2012/0263940 A1 | 10/2012 | Arzberger et al. | |
| 2016/0217961 A1* | 7/2016 | Rand | H01J 1/025 |
| 2018/0009951 A1* | 1/2018 | Gubbels | C08K 5/057 |
| 2018/0261518 A1* | 9/2018 | Eisele | H01L 23/467 |

FOREIGN PATENT DOCUMENTS

| | | |
|---|---|---|
| JP | 2000-141505 A | 5/2000 |
| JP | 2003-183498 A | 7/2003 |
| JP | 2007-291220 A | 11/2007 |
| WO | 02/096636 A1 | 12/2002 |
| WO | 2013/069782 A1 | 5/2013 |
| WO | 2014/203875 A1 | 12/2014 |

OTHER PUBLICATIONS

Bayer, R. et al., "Dry Mortars," Ullmann's Encyclopedia of Industrial Chemistry, Wiley-VCH Verlag GmbH & Co. KGaA, Jan. 15, 2003, pp. 1-26 (26 pages).

\* cited by examiner

ELECTRICAL DEVICE HAVING A COVERING MATERIAL

This application is a 35 U.S.C. § 371 National Stage Application of PCT/EP2016/077919, filed on Nov. 17, 2016, which claims the benefit of priority to Serial No. DE 10 2015 223 443.6, filed on Nov. 26, 2015 in Germany, the disclosures of which are incorporated herein by reference in their entirety.

The present disclosure relates to an electrical device having an electrical component at least partly enveloped by an envelope material, and to a method of producing an electrical device of this kind.

BACKGROUND

It is extremely important nowadays to increase the reliability and efficiency and lower the costs of high-performance electronic modules and robust sensor systems. The current envelope materials (epoxy compounds, silicone materials) are limited to a temperature range below 200° C. The opening-up of the temperature range of up to 300° C. or 350° C. for envelope materials can extend the operating range of modern high-performance semiconductors (e.g. SiC) beyond 200° C. without having to dispense with the added function of an envelope material (e.g. protection from environmental effects, improved thermal properties).

DE102013112267A1 discloses a semiconductor module having an envelope material composed of different types of cement that covers a semiconductor unit. This envelope material includes electrically nonconductive inorganic fibers to increase the tensile strength.

SUMMARY

The present disclosure provides an electrical device having an electrical component at least partly enveloped by an envelope material comprising a cement material, wherein the envelope material also includes particles comprising a first material and fibers comprising a second material, where said first material and said second material have a higher coefficient of thermal conductivity than the cement of the cement material.

The present disclosure further provides a method of producing an electrical device having an electrical component at least partly enveloped by an envelope material comprising a cement material, having the following steps:
  providing the cement material;
    mixing the particles including the first material into the cement material, where the first material has a higher coefficient of thermal conductivity than the cement of the cement material;
    mixing the fibers including the second material into the cement material, where the second material has a higher coefficient of thermal conductivity than the cement of the cement material;
    applying the envelope material including the cement material comprising the particles including the first material and the fibers including the second material to the electrical component; and
    heat-treating the envelope material.

The present disclosure also provides for the use of a material including a cement material as envelope material for an electrical component of an electrical device, wherein the envelope material further includes particles including a first material and fibers including a second material, wherein the first material and second material have a higher coefficient of thermal conductivity than the cement of the cement material.

The electrical component may, for example, be a semiconductor component, a sensor element, an inductance, a capacitance, a battery cell, a battery module or a circuit arrangement. However, an electrical component in the context of the present disclosure may be understood to mean any active and passive component or high-performance component. The electrical device here may have a carrier substrate on which the electrical component is disposed.

A cement in the context of the present disclosure may be understood to mean an inorganic, metal-free, hydraulic binder. The cement hardens here in a hydraulic manner, meaning that a chemical reaction with water takes place to form stable, insoluble compounds. At the start of the process or prior to the hydration, the cement here may be in the form of a finely ground powder, which reacts with water or added water to form hydrates, solidifies and hardens. The hydrates here may form needles and/or, which intermesh and hence lead to a high strength of the cement. By contrast, a phosphate cement does not harden in a hydraulic manner. An acid-base reaction takes place to form a salt gel, which solidifies at a later stage to give a usually amorphous material. In the acid-base reaction, $H^+$ (hydrogen ions) are exchanged.

The cement may consist predominantly of calcium aluminates, and may form calcium aluminate hydrates during the hydration. It is advantageous when the cement material includes calcium aluminate cement, and especially consists of calcium aluminate cement. Calcium aluminate cement (abbreviation: CAC) is subject to the European standard DIN EN 14647. Calcium aluminate cement consists predominantly of monocalcium aluminate ($CaO*Al2O3$).

The calcium aluminate cement may have, for example, the following composition:
  $Al2O3$: not less than 67.8% by weight
  $CaO$: not more than 31.0% by weight
  $SiO2$: not more than 0.8% by weight
  $Fe2O3$: not more than 0.4% by weight The particles may take the form of a filler. The particles may take the form of spheres, irregular polyhedra, fragments and/or platelets. According to the disclosure, the particles include a first material having a higher coefficient of thermal conductivity than the cement of the cement material. The cement has a coefficient of thermal conductivity of 1 W/(m·K). Accordingly, the first material of the particles has a coefficient of thermal conductivity of greater than 2 W/(m·K). The particles may preferably also consist of the first material. The first material may also be a group of materials.

The fibers may take the form of solid fibers, hollow fibers and/or nanotubes. According to the disclosure, the fibers include a second material having a higher coefficient of thermal conductivity than the cement of the cement material. Accordingly, the second material likewise has a coefficient of thermal conductivity of greater than 2 W/(m·K). The fibers may preferably also consist of the second material. The second material may also be a group of materials. The fibers may have a diameter in the range from not less than 100 nm to not more than 100 μm. The fibers may have a length in the range from not less than 1 μm to not more than 100 μm.

The particles and the fibers may be mixed into a dry cement material or cement powder mixture, i.e. before any added water is mixed in. Alternatively, the particles and the fibers may be mixed into the wet cement material or cement powder mixture, i.e. after any added water has been mixed in.

An envelope material in the context of the present disclosure may be understood to mean any type of encapsulation (packaging). The envelope material may take the form of a cement composite. In other words, the envelope material may include a cement matrix comprising the particles and the fibers. The envelope material may have the following composition:

calcium aluminate cement binder: not less than 8% by weight to not more than 47% by weight (for example SECAR 71)

water reactant: not less than 10% by weight to not more than 28% by weight fibers and/or nanotubes: not less than 5% by weight to not more than 85% by weight filler: not less than 25% by weight to not more than 82% by weight The step of heat treatment may, in the context of the present disclosure, comprise a hydration step and/or setting step and/or drying step and/or hardening step. The heat treatment may comprise a tempering step in a tempering furnace. The heat treatment can be effected within a temperature range from not less than 40° C. to not less equal than 95° C.

The provision of particles and fibers each having a higher coefficient of thermal conductivity than the cement of the cement material now makes it possible to distinctly increase the thermal conductivity of the envelope material and hence to increase the dissipation of the heat generated by the electrical component. This effect occurs not just owing to the material properties, i.e. the higher coefficient of thermal conductivity of the particles and the fibers, but especially also because of the arrangement of the particles and fibers, since an improvement in heat transfer from one particle or fiber to the other particle or fiber is thus enabled. Thus, the electrical component can be cooled very efficiently, which in turn enables higher operating temperatures. This also leads to an increase in efficiency of and to a reduction in the design space occupied by the electrical device.

It is advantageous when the first material of the particles and/or the second material of the fibers has a crystal structure, and is especially a ceramic or metallic material. It is particularly advantageous when the particles and the fibers consist of one or the same ceramic material and/or of a metallic material. It is also advantageous when the difference in the coefficient of thermal expansion (CTE) of the first material, the second material and the cement is small. The first material and second material may be selected from the group consisting of: Al2O3, alpha-Si3N4, hex. BN, SiC and AlN. The coefficient of thermal expansion of the cement is in the range of $4-12\times10^{-6}$/K. These materials are of particularly good suitability since they have a high coefficient of thermal conductivity, and a coefficient of thermal expansion close to that of cement.

It is also advantageous when the particle size distribution of the particles in the envelope material is unimodal or bimodal. It is advantageous here when the maximum of the unimodal particle size distribution is about 10 μm or 100 μm and when the maxima of the bimodal particle size distribution are about 10 μm and about 100 μm. It is particularly advantageous when the particle size distribution of the particles approximates to the Fuller distribution.

A frequency distribution having just one peak is called "unimodal" or "monomodal". A typical example of this is the normal distribution, which is also symmetric. Many unimodal (single-peak) frequency distributions, by contrast, are asymmetric (e.g. "left-skewed"). In a unimodal particle size distribution, particles of a moderate particle size have the greatest frequency. There are no further main maxima in the particle size distribution. For production-related reasons, there can be one or more secondary maxima at particle sizes of no relevance for the measurement. The corresponding unimodal particle size distribution may have a sharp or broad configuration around the maximum having the median particle size. In the case of a "sharp" particle size distribution, the frequency decreases significantly proceeding from the maximum. In the case of a broad particle size distribution, particle sizes having a more significant distance from the median particle size also still have a relevant frequency.

A bimodal distribution in mathematics is a probability distribution or frequency distribution in which the density or estimate thereof has two modes. It is a multimodal distribution (also having multiple peaks), since, by contrast with the unimodal distribution, it has more than one maximum. A bimodal distribution may be either symmetric or asymmetric. A bimodal particle size distribution can be considered to be a superimposition of unimodal particle size distributions. The first material of the particles may also comprise a group of materials. Accordingly, in the context of this disclosure, in the case of the bimodal particle size distribution, the particles of the two modes may not only have different particle sizes, but also different materials.

It has been found that, as well as the chemical/mineralogical characteristics, in particular, the particle shape, particle size and particle gradation or particle size distribution of the particles or of the filler are of great significance for the quality of the envelope material or the cement composite. A factor of crucial significance for the density and strength of the envelope material or of the cement composite is the particle size and particle size distribution, or the correct ratio of the individual particle size classes to one another. One aspect of the present disclosure is based on the finding that the thermal conductivity of the envelope material or of the cement composite rises with increasing packing density of the particles or of the filler. Accordingly, the two requirements to be met are: very small interstices between the particles and very low surface area of the particles.

For example, in the case of a unimodal particle size distribution, it is possible to combine ceramic or metallic particles having a diameter of about 10 μm (greatest frequency) and ceramic or metallic fibers having a diameter of up to 10 μm. Alternatively, it is also possible to combine ceramic or metallic particles having a diameter of about 100 μm (greatest frequency) and ceramic or metallic fibers having a diameter of up to 100 μm. The particles fill the interstices between the fibers and hence promote a network-like alignment of the fibers, such that additional thermal conduction pathways arise in the envelope material, which increase the overall thermal conductivity.

In the case of the bimodal particle size distribution or else in the case of the multimodal particle size distribution, the abovementioned effect is enhanced since the smaller particles fill the interstices between the larger particles, and hence further increase the (packing) density and the number of contact points. The bimodal or multimodal particle size distribution can consequently further increase the thermal conductivity between the particles and the fibers, and hence the thermal conductivity of the overall envelope material.

A particularly high (packing) density can be achieved in a particle size distribution which approximates to the Fuller distribution. The particle/grain packing according to Fuller can be described as follows:

$$A_{(d)} = \left(\frac{d}{d_{max.}}\right)^q$$

where $A_{(d)}$: proportion by mass with grain Ø less than d
$d_{max.}$: largest Ø of the grain blend
d: grain Ø ($0<d<d_{max.}$)
q: grain size exponent.

The particle/grain packing having the lowest level of cavities or the particle/grain blend having the lowest level of cavities is found here at q=0.4.

Accordingly, it is particularly advantageous when the particles form a particle blend having a multitude of particle sizes, where the particle blend approximates or has been matched to the Fuller distribution. The Fuller distribution arises here through the superimposition of multiple particle blends in uni- and/or bimodal distribution. Consequently, it is possible to achieve a particle distribution with an extremely small level of cavities, where the individual particles in the cement material have many contact points or areas, which in turn increase the heat transfer from particle to particle and hence can increase the thermal conductivity of the overall cement material.

It is also advantageous when the particles and the fibers are arranged in the cement material. Accordingly, the particles and the fibers are enveloped by the cement material. In this case, the particles and the fibers are preferably distributed homogeneously in the cement material. This measure allows the amount of heat released by the electrical component to be guided very efficiently through the cement material to the particles and fibers, in order then to be released by the fibers to the environment.

It is additionally advantageous when an electrically insulating layer arranged between the envelope material and the electrical component has been provided. The electrically insulating layer may preferably include Parylene HT or cement (without the particles and fibers), or consists thereof. This measure ensures that, in the case of electrically conductive fibers, the electrical component is electrically insulated from the envelope material comprising the electrically conductive fibers and no short circuits arise as a result.

In addition, it is advantageous when the following step is additionally envisaged: aligning the fibers after the step of applying the envelope material to the electrical component. By means of this step, the fibers can be specifically aligned outward, away from the electrical component. By means of this step, the fibers can also be aligned such that, as elucidated above, they form a kind of network. By virtue of the directed heat pathways or the elevated number of heat pathways, the amount of heat generated can be dissipated quickly and efficiently to the environment.

BRIEF DESCRIPTION OF THE DRAWINGS

The disclosure is elucidated in detail by way of example hereinafter with reference to the appended drawings. The drawings show.

Figure 1:
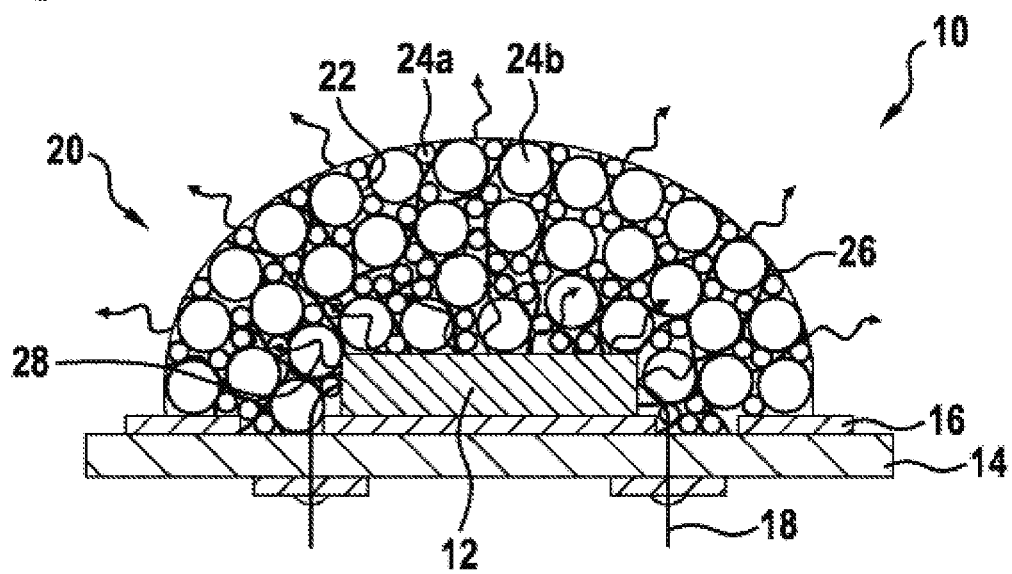
FIG. 1 a diagram of an electrical device in one working example of the present disclosure.
Figure 2:
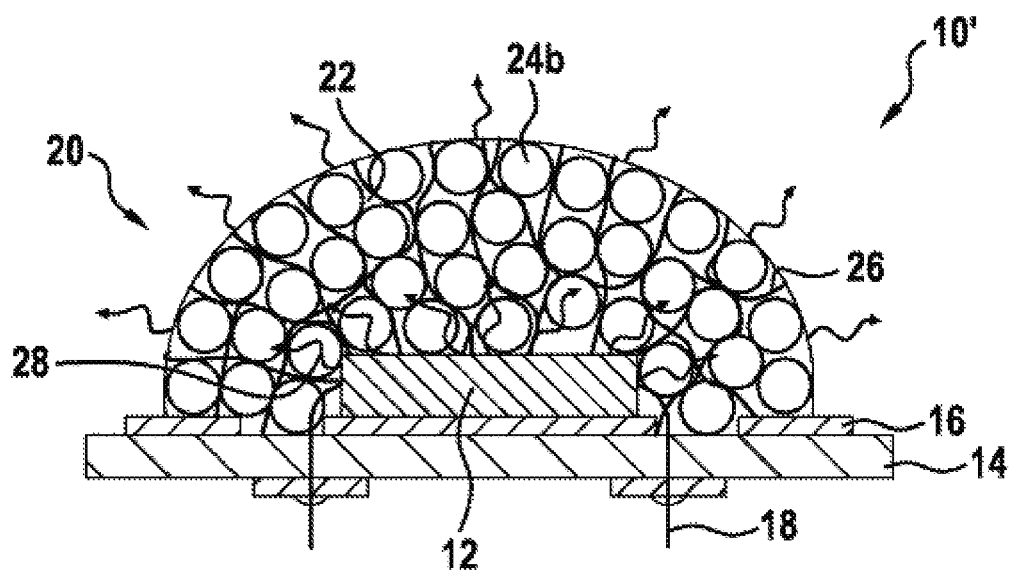
FIG. 2 a diagram of an electrical device in a further working example of the present disclosure.

The disclosure is elucidated in detail by way of example hereinafter with reference to the appended drawings. The drawings show:

FIG. 1 a diagram of an electrical device in one working example of the present disclosure;
FIG. 2 a diagram of an electrical device in a further working example of the present disclosure; and
FIG. 3 a diagram of an electrical device in a further working example of the present disclosure.

DETAILED DESCRIPTION

FIG. 1 shows an inventive electrical device which, in its entirety, has been given the reference numeral 10.

The electrical device 10 has an electrical component 12. The electrical component 12 takes the form of a semiconductor component 12. The electrical component 12 has been arranged on a carrier substrate 14. A copper layer 16 has been arranged between the electrical component 12 and the carrier substrate 14. The copper layer 16 here has multiple functions, namely that of improving the intake and removal of heat, providing a means of electrical contacting for the electrical component 12, and if necessary of acting as a flow barrier to the envelope material on application.

The electrical component 12 is connected via bonding wires 18 to the opposite side of the carrier substrate 14 therefrom, which enables electrical contacting of the electrical component 12 from the outside. In this case, the carrier substrate 14 may take the form, for example, of a plate into which conductor tracks or electrical contacts for contacting of the electrical component 12 may also be integrated. The conductor tracks may also be arranged on a surface of the carrier substrate 14. The carrier substrate 14 may be designed to form a chip.

The electrical device 10 also includes an envelope material 20 including a cement material 22. The envelope material 20 or the cement material 22 takes the form of a glob top. The envelope material 20 or the cement material 22 is disposed on the carrier substrate 14. The cement material 22 here envelops the electrical component 12 on the surfaces uncovered by the carrier substrate 14. Accordingly, the electrical component 12 is fully enveloped by the carrier substrate 14 and the envelope material 20. The cement material 22 additionally also covers part of the carrier substrate 14 via which it is firmly bonded to the carrier substrate 14.

The envelope material 20 or the cement material 22 includes a multitude of particles 24a, 24b, which form a particle blend, and a multitude of fibers 26. Accordingly, the particles 24a, 24b and the fibers 26 are enveloped by the cement material 22. The particles 24a, 24b and the fibers 26 are arranged in a distribution in the cement material 22. The particles 24a, 24b and the fibers 26 are preferably arranged essentially in homogeneous distribution. According to the disclosure, the particles 24a, 24b and the fibers 26 include a material having a higher coefficient of thermal conductivity in each case than the cement of the cement material 22. The particles 24a, 24b and the fibers 26 consist here of a ceramic material. As apparent from FIG. 1, the particles 24a, 24b fill the interstices between the fibers 26, by means of which the fibers 26 are held apart and form a kind of three-dimensional network. The effect of this is that additional contact points and hence thermal conduction pathways form in the envelope material 20. An amount of heat 28 released by the electrical component 12 can consequently be dissipated to the environment particularly efficiently via the particles 24a, 24b and especially the fibers 26.

In the preferred embodiment from FIG. 1, the particle size distribution of the particles 24a, 24b is bimodal. The first maximum of the smaller particles 24a here is about 10 µm. The second maximum of the larger particles 24b is about 100 µm. The number of different particle sizes can understandably vary greatly—for example depending on whether the particle size distribution at the maxima is broad or sharp—with only the particles having the two greatest frequencies (maxima) being shown for presentational reasons. Owing to the bimodal particle size distribution and the corresponding selection of the maxima, the smaller particles 24a can fill the interstices between the larger particles 24b, which achieves a high (packing) density of the particle blend and consequently a high thermal conductivity. In order to obtain an optimal (packing) density, the particle blend is a multitude of further particles (not shown) with different particle sizes on, where the particle size distribution in the particle blend approximates to the Fuller distribution. The particle/grain packing having the lowest level of cavities or the particle/grain blend having the lowest level of cavities, according to Fuller, can be described as follows:

$$A_{(d)} = \left(\frac{d}{d_{max.}}\right)^q$$

where q is chosen as 0.4.

FIG. 2 shows a further inventive electrical device 10'. The electrical device 10' is of analogous construction to the device 10 from FIG. 1. However, the electrical device 10' has a unimodal particle size distribution of particles 24b. The maximum of the particle size distribution of the particles 24b may, for example, be about 100 µm. The particles 24b are arranged essentially in homogeneous distribution and fill the gaps between the fibers 26. The particles 24b and the fibers 26 consist of a ceramic material. The number of different particle sizes can understandably vary greatly here as well, with only the particles 24b having the greatest frequency (maximum) included in the drawing for presentational reasons.

Figure 3:
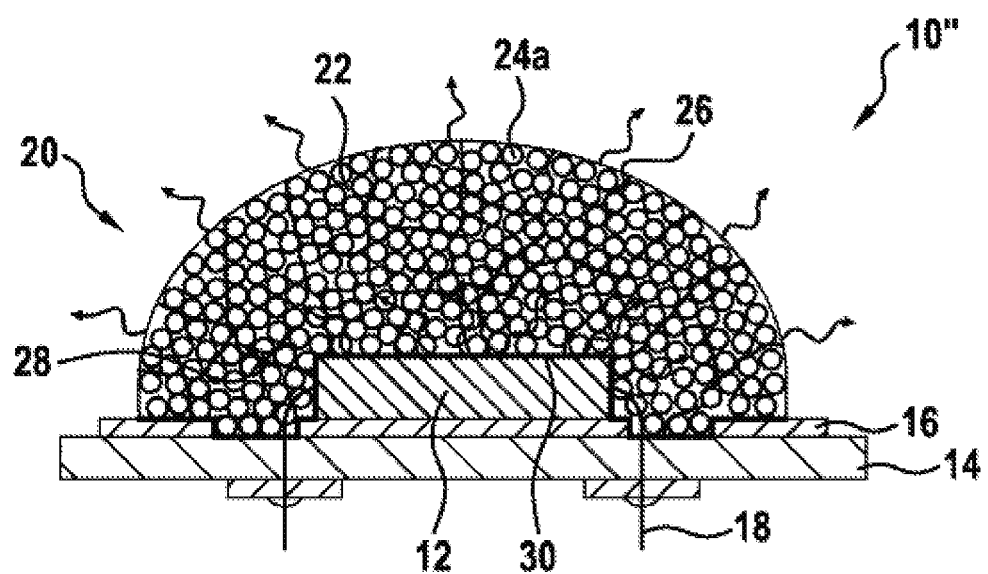
FIG. 3 a diagram of an electrical device in a further working example of the present disclosure.

FIG. 3 shows a further inventive electrical device 10''. The electrical device 10' is of analogous construction to the device 10' from FIG. 2 and likewise has a unimodal particle size distribution, but with smaller particles 24a. The maximum of the particle size distribution of the particles 24a here is about 10 µm. The particles 24a are arranged essentially in homogeneous distribution and fill the gaps between the fibers 26. The number of different particle sizes can understandably vary greatly here as well, with only the particles 24a having the greatest frequency (maximum) included in the drawing for presentational reasons.

A further difference from the two above-described embodiments 10 and 10' is that the particles 24a and the fibers 26 consist of a metallic material and are thus electrically conductive. Since the particles 24a and the fibers 26 can cause unwanted short-circuits because of their electrical conductivity, the electrical device 10'' also has an electrically insulating layer 30. The electrically insulating layer 30 is arranged between the envelope material 20 and the electrical component 12. The electrically insulating layer 30 takes the form of a thin layer. The electrically insulating layer 30 extends over the entire interface between the envelope material 20 the electrical component 12 or the carrier substrate 14. The electrically insulating layer 30 accordingly envelops the electrical component 12 and hence forms an electrical insulation from the particles 24a and the fibers 26.

In the production of the electrical device 10 from FIG. 1, first of all, the cement material 22 is provided, for example in powder form. The particles 24a, 24b and the fibers 26 are subsequently mixed into the cement material 22. In this context, particular attention has to be paid to the particle size distribution, which approximates to the Fuller distribution having the particle/grain packing with the lowest level of cavities, in order later to achieve a maximum packing density in the envelope material 20. Subsequently, a liquid component, for example water, is mixed in together with, optionally, the Melflux flux. The moist envelope material 20 including the cement material 22, the particles 24a, 24b, the fibers 26 and the water is then evacuated, applied to the electrical component 12 and brought into shape, for example by means of injection molding or casting in molds. Subsequently, the fibers 26 are aligned, for example by agitation and/or pressing, which forms a kind of fiber network. Subsequently, the envelope material 20 is heat-treated or tempered, for example at 60° C. and 90% relative humidity, which results in gel formation, crystallization, needling and curing of the cement material 22. In this case, the air humidity prevents any loss of water (water/cement value), and the temperature brings about formation of the desired structures. Finally, the envelope material 20 is optionally treated with the particles 24a, 24b and the fibers 26, then demolded and subjected to aging treatment, for example at 300° C.

The invention claimed is:

1. An electrical device, comprising:
an electrical component at least partly enveloped by an envelope material, the envelope material including a cement material comprising cement, particles comprising a first material, and fibers comprising a second material,
wherein the first material and the second material each have a higher coefficient of thermal conductivity than the cement of the cement material,
wherein the particles define a particle blend having a multitude of particle sizes, the particle blend having a particle size distribution that is bimodal,
wherein the bimodal particle size distribution has a first maximum and a second maximum that is greater than the first maximum by a factor of at least 10, and
wherein the first and second maxima of the bimodal particle size distribution are about 10 µm and about 100 µm, respectively.

2. The electrical device as claimed in claim 1, wherein the cement of the cement material comprises calcium aluminate cement or consists of calcium aluminate cement.

3. The electrical device as claimed in claim 1, wherein the first material of the particles and/or the second material of the fibers includes a crystal structure and is a ceramic material or a metallic material.

4. The electrical device as claimed in claim 1, wherein the particles and the fibers consist of a ceramic material and/or of a metallic material.

5. The electrical device as claimed in claim 1, wherein (i) a proportion of the fibers is within a range from not less than 5% by weight to not more than 70% by weight, based on a total weight of the envelope material, and/or (ii) a proportion of the particles is within a range from not less than 25% by weight to not more than 82% by weight, based on the total weight of the envelope material.

6. An electrical device, comprising:
an electrical component at least partly enveloped by an envelope material, the envelope material including a cement material comprising cement, particles comprising a first material, and fibers comprising a second material,
wherein the first material and the second material each have a higher coefficient of thermal conductivity than the cement of the cement material, and
wherein a particle size distribution of the particles approximates to a Fuller distribution, described as:

$$A_{(d)} = \left(\frac{d}{d_{max.}}\right)^q$$

where:
$A_{(d)}$: proportion by mass with grain Ø less than d,
$d_{max.}$: largest Ø of the grain blend,
d: grain Ø ($0<d<d_{max.}$),
q: grain size exponent, and
wherein, to achieve a particle/grain packing having the lowest level of cavities or a particle/grain blend having the lowest level of cavities, q=0.4.

7. The electrical device as claimed in claim 1, wherein the particles and the fibers are arranged within the cement material.

8. The electrical device as claimed in claim 1, further comprising an electrically insulating layer arranged between the envelope material and the electrical component.

9. The electrical device as claimed in claim 1, wherein the electrical component is a semiconductor component, a sensor element, an inductance, a capacitance, a battery cell, a battery module, or a circuit arrangement.

10. The electrical device as claimed in claim 1, wherein the bimodal particle size distribution is symmetric.

11. The electrical device as claimed in claim 1, wherein the bimodal particle size distribution is asymmetric.

12. The electrical device as claimed in claim 1, wherein the particles fill interstices between the fibers and hold a majority of the fibers apart in a network-like arrangement.

13. The electrical device as claimed in claim 1, wherein:
the particles of the particle blend include first particles comprising the first material and second particles comprising a third material that is different than the first material, and
the first maximum corresponds to the first particles and the second maximum corresponds to the second particles.

14. The electrical device as claimed in claim 1, wherein:
the particles of the particle blend include first particles having a plurality of first particle sizes and second particles having a plurality of second particle sizes,
the first maximum corresponds to the first particles and the second maximum corresponds to the second particles, and
the bimodal particle size distribution at the first and second maxima is sharp so as to minimize overlap between the first and second particles sizes.

* * * * *